(12) United States Patent
Hara

(10) Patent No.: US 8,315,098 B2
(45) Date of Patent: Nov. 20, 2012

(54) MEMORY SYSTEM

(75) Inventor: Tokumasa Hara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/273,876

(22) Filed: Oct. 14, 2011

(65) Prior Publication Data

US 2012/0092927 A1    Apr. 19, 2012

(30) Foreign Application Priority Data

Oct. 15, 2010    (JP) ................................. 2010-233104

(51) Int. Cl.
G11C 11/34    (2006.01)

(52) U.S. Cl. ......... 365/185.17; 365/189.05; 365/230.03; 365/201

(58) Field of Classification Search ............. 365/185.17, 365/189.05, 230.03, 201
See application file for complete search history.

(56) References Cited

U.S. PATENT DOCUMENTS

| 7,260,670 | B2 | 8/2007 | Kawai |
| 7,295,470 | B2 | 11/2007 | Park et al. |
| 7,304,893 | B1 * | 12/2007 | Hemink ................. 365/185.22 |
| 7,372,744 | B2 | 5/2008 | Shiga et al. |

FOREIGN PATENT DOCUMENTS

JP    2006-73141    3/2006

* cited by examiner

*Primary Examiner* — Jason Lappas
(74) *Attorney, Agent, or Firm* — Oblon, Spivak, McClelland, Maier & Neustadt, L.L.P.

(57) ABSTRACT

A memory system includes a NAND flash memory having a page buffer capable of holding a page of data and a cell array having a plurality of pages. The system also includes a plurality of memory portions electrically connected to the NAND flash memory via a data bus, and a controller for controlling the NAND flash memory and the plurality of memory portions. A width of the data bus is less than a size of the page of data. When any one of a write operation and a read operation is performed on the NAND flash memory, the controller exchanges data held in the page buffer and data held in one memory portion of the plurality of memory portions.

15 Claims, 6 Drawing Sheets

(S4-1) The state machine 32 requests the address/command generator circuit 31 to issue a desired command and the first data is transferred to the ECC buffer 25a (S4-2) The ECC engine 25b transfers the first data from the ECC buffer 25a to the SRAM buffer 21c (S4-3) The SRAM buffer 21c transfers the first data to the first data RAM

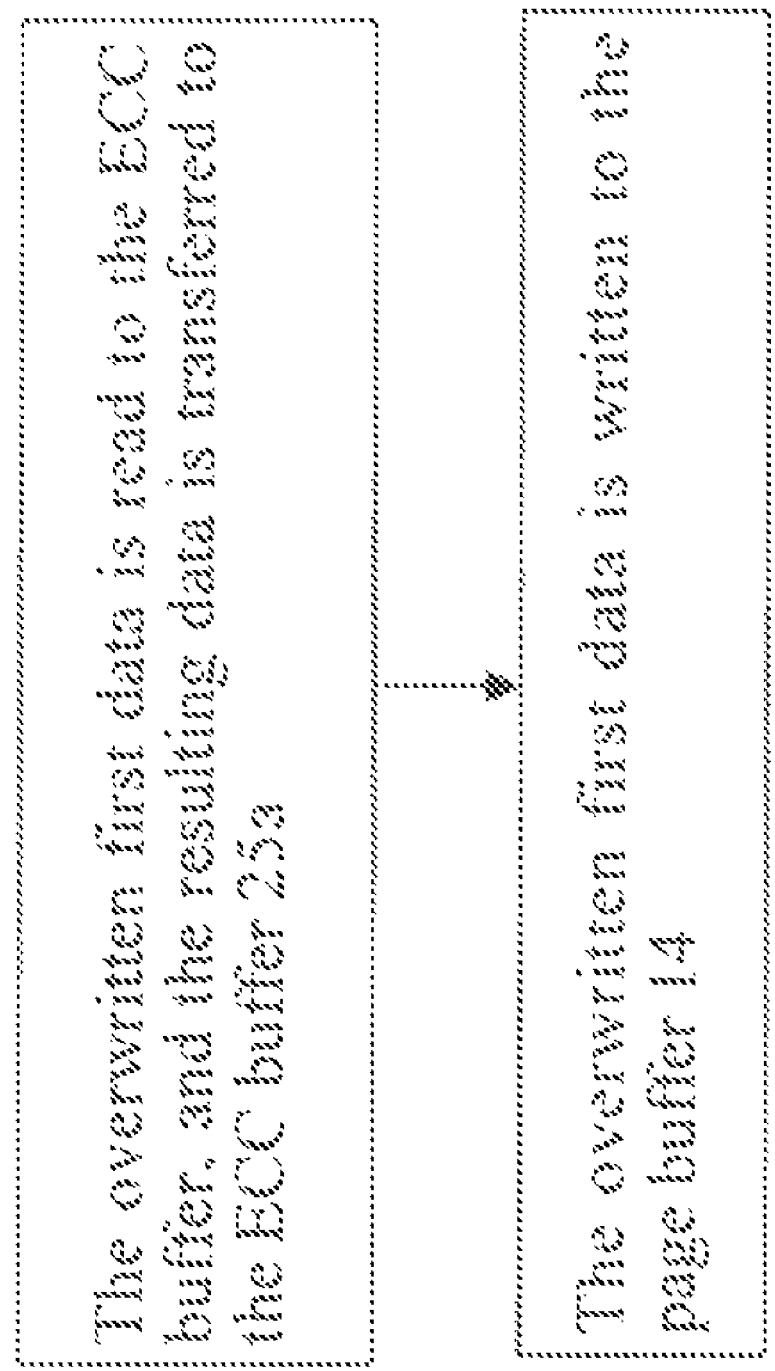

MEMORY SYSTEM

CROSS-REFERENCE TO RELATED APPLICATIONS

This application is based upon and claims the benefit of priority from the prior Japanese Patent Application No. 2010-233104, filed Oct. 15, 2010, the entire contents of which are incorporated herein by reference.

BACKGROUND

1. Field

Embodiments described herein relate generally to a memory system, and for example, a semiconductor memory system including multiple types of memories integrated in a single chip, or the like.

2. Discussion of the Background

An example of a semiconductor memory system including multiple types of memories integrated in a single chip is a semiconductor memory system including a NAND flash memory (memory unit) and a SRAM (Static Random Access Memory) integrated in a single chip (see Japanese Patent Application Publication No. 2006-73141).

BRIEF DESCRIPTION OF THE DRAWINGS

FIG. 6 is a flowchart diagram showing how data is transferred using the memory system of a further embodiment.

DESCRIPTION OF THE PREFERRED EMBODIMENTS

Figure 1:
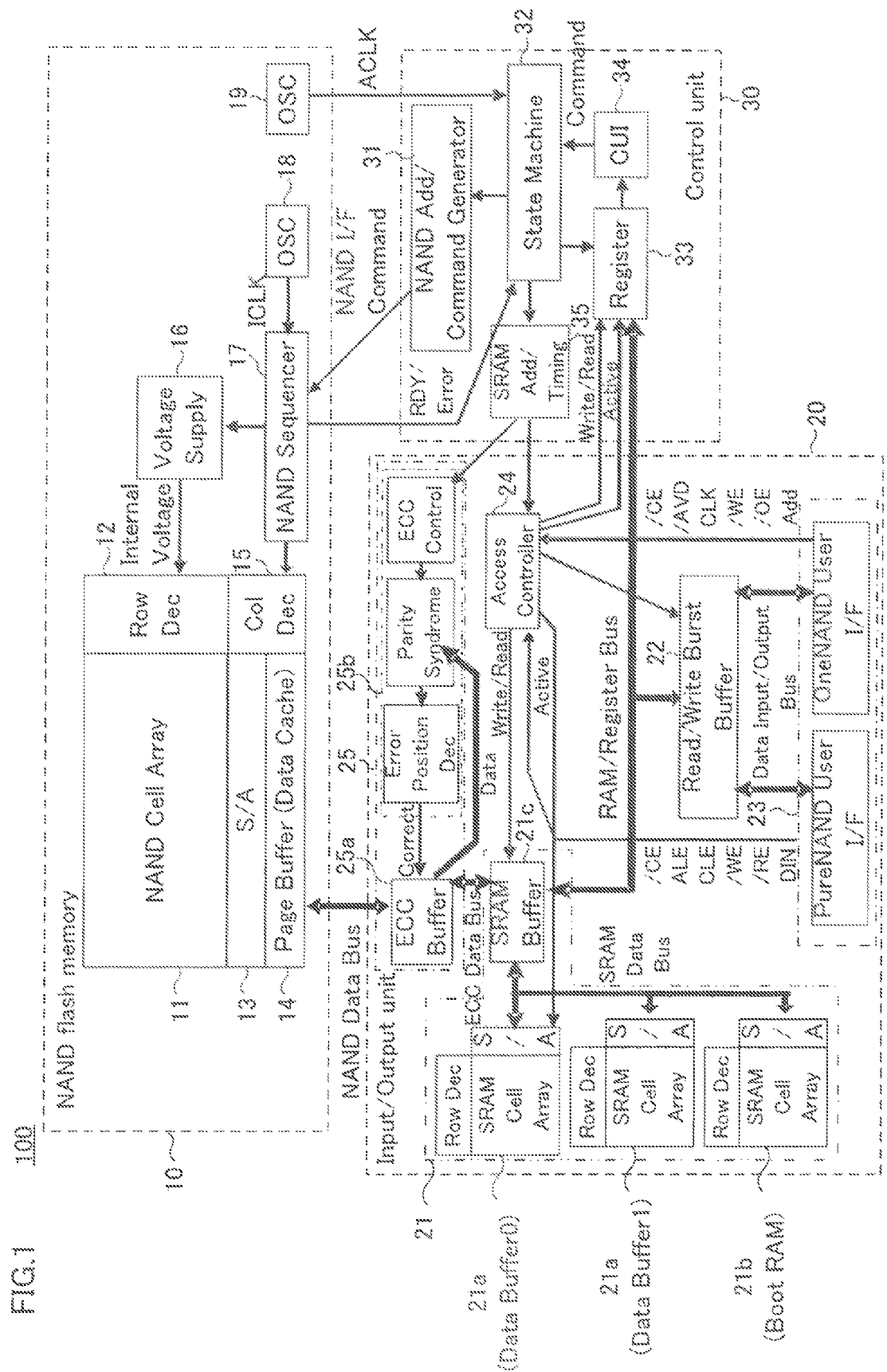
FIG. 1 is a block diagram showing a memory system of a first embodiment.

In general, according to one embodiment, a memory system includes a NAND flash memory including a cell array which has a plurality of pages and a page buffer capable of holding a page of data. The memory system also includes a plurality of memory portions electrically connected to the NAND flash memory by a data bus, and a controller configured to control the NAND flash memory and the plurality of memory portions. A width of the data bus is less than a size of a page, and when any one of a write operation and a read operation is performed on the NAND flash memory, the controller exchanges data held in the page buffer with data held in one memory portion out of the plurality of memory portions.

First Embodiment

Referring to the drawings, description will be provided for a first embodiment. For the convenience of explanation, the same portions will be denoted by the same reference signs throughout all the drawings. In addition, dimensional ratios among portions are not limited to those indicated in the drawings.

[Configuration of Memory System]

A memory system of the first embodiment will be described by use of a block diagram shown in FIG. 1.

As shown in FIG. 1, a memory system 100 includes a NAND flash memory 10, an input/output unit 20 and a control unit 30 (aka, controller 30). For example, in the memory system 100, the NAND flash memory 10, the input/output unit 20 and the controller 30 are formed on the same semiconductor substrate, and are accordingly integrated in a single chip.

<NAND Flash Memory>

First of all, the NAND flash memory 10 will be described by use of FIG. 1 and a circuit diagram shown in FIG. 2.

The NAND flash memory 10 functions as a main memory unit of the memory system 100. As shown in FIG. 1, the NAND flash memory 10 includes a memory cell array 11, a row decoder 12, a sense amplifier (S/A) 13, a page buffer 14, a column decoder 15, a voltage supply 16 (aka, voltage generating circuit 16), a sequencer 17 and oscillators 18, 19.

<<Memory Cell Array>>

Figure 2:
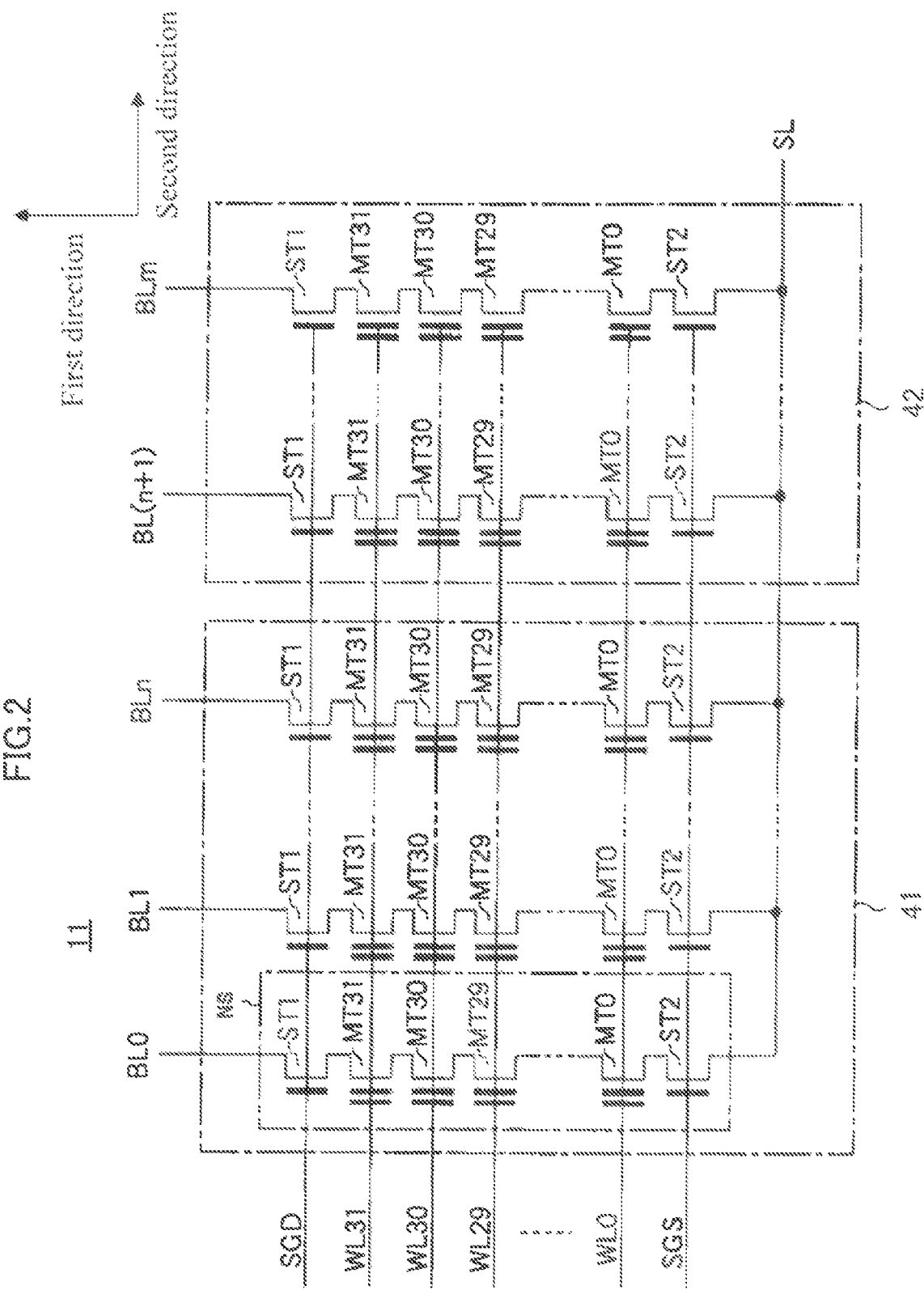
FIG. 2 is a circuit diagram showing a memory cell array of the first embodiment.

As shown in FIG. 2, the memory cell array 11 is formed from multiple NAND strings NS which are arrayed in a matrix. The memory cell array 11 includes: a first region 41 for storing usual data, and a second region 42 for storing additional data. The second region 42 is used as a spare region for the first region 41. For example, a parity for error correction is stored in the second region 42.

Multiple bit lines BL0 to BLm are arranged, extending in a direction in which the NAND strings NS extend (i.e., in a first direction), over the NAND strings above a semiconductor substrate (not illustrated). The multiple bit lines BL0 to BLm are electrically connected to respective end portions of the NAND strings NS.

On the other hand, multiple word lines WL0 to WL31 are arranged, extending in a direction (i.e., in a second direction) orthogonal to the direction in which the NAND strings NS extend, side-by-side at predetermined intervals in the first direction. In this respect, the direction in which the NAND strings NS extend is concurrently a direction in which active regions extend.

Multiple selection gate lines SGS, SGD are arranged in parallel outside the respective word lines WL0 to WL31 with the multiple word lines WL0 to WL31 arranged between the gate lines SGS and SGD.

Each NAND string NS includes multiple memory cells MT0 to MT31, as well as first and second selection gate transistors ST1, ST2. Each memory cell MT has a stacked gate structure which includes a charge storage layer formed above the semiconductor substrate with a gate insulating film interposed in between, and a control gate formed above the charge storage layer with an inter-gate insulating film interposed in between. Incidentally, the number of memory cells MT is not limited to 32, and may be any one of 8, 16, 34, 128, 256 and the like. No specific restriction is imposed on the number of memory cells MT. In addition, each memory cell transistor MT may have a MONOS (Metal Oxide Nitride Oxide Silicon) structure which is obtained by a method of trapping electrons in a nitride film, instead of the stacked gate structure.

The multiple memory cells MT0 to MT31 are formed in portions corresponding to intersections between the word lines WL and the corresponding bit line BL, and are connected together in series in the direction in which the active regions (whose illustration is omitted) (i.e., in the first direction).

In addition, as shown in FIG. 2, the first selection gate transistors ST1 on the side of the bit lines BL are connected to the memory cells MT31 in series, respectively. The second selection gate transistors ST2 on the side of the source lines SL are connected to the memory cells MT0 in series, respectively. The source line SL is commonly connected to the NAND strings NS.

As shown in FIG. 2, the control gates of each corresponding memory cell MT arranged in the second direction throughout all the NAND strings NS are commonly connected to a corresponding word line WL. In addition, the control gates of the first selection gate transistors ST1 arranged in the second direction are connected to the first selection gate line SGD. The control gates of the second selection gate transistors ST2 arranged in the second direction are connected to the second selection gate line SGS.

The multiple NAND strings NS are formed in a matrix inside the memory cell array 11. Each set of memory cells MT sharing the same word line WL throughout all the NAND strings NS constitutes a page, which is a data reading/writing unit. Furthermore, each set of multiple NAND strings NS sharing the same word line WL constitutes a block, which is a data erasing unit.

<<Sense Amplifier and Page Buffer>>

The sense amplifier (corresponding to "S/A" in FIG. 1) 13 and the page buffer 14 constitute a buffer memory capable of holding one page of data, and function as a secondary data cache for the NAND flash memory 10. Incidentally, description will be later provided for a primary data cache for the NAND flash memory 10.

During a data read operation, the sense amplifier 13 senses/amplifies and temporarily holds data which is read from the memory cell array 11, and transfers the data to the page buffer 14. In addition, during a data write operation, the sense amplifier 13 programs data, which is transferred to the sense amplifier 13 from the page buffer 14, by transferring the data to a bit line(s) BL.

The page buffer 14 is connected to the input/output unit 20 via a NAND data bus (corresponding to "NAND Data Bus" in FIG. 1). The data path width of the NAND data bus in this example is four bytes, although the invention includes other data path widths as well. During the data read operation, the page buffer 14 transfers the data, which is transferred to the page buffer 14 from the sense amplifier 13, to the input/output unit 20. On the other hand, during the data write operation, the page buffer 14 temporarily holds data which is transferred to the page buffer 14 from the input/output unit 20, and transfers the data to the sense amplifier 13.

The sense amplifier 13 and the page buffer 14 include latch circuits provided to the respective bit lines BL, for example. This enables the sense amplifier 13 to hold one page of data (the page size is 4 kilobytes, for example).

<<Row Decoder and Column Decoder>>

The row decoder 12 selects a desired word line(s) WL in the memory cell array 11. In addition, the column decoder 15 selects a desired column(s), namely, a desired bit line(s) BL in the memory cell array 11.

<<Voltage Generating Circuit>>

The voltage generating circuit 16 generates a voltage needed to program, read or erase data by raising or dropping a voltage given from the outside. Thus, the voltage generating circuit 16 supplies the generated voltage to the row decoder 12, for example. Hence, the voltage generated by the voltage generating circuit 16 is applied to a word line (s) WL.

<<Sequencer>>

The sequencer 17 controls the operation of the NAND flash memory 10 as a whole. Once receiving a NAND interface command ("NAND I/F command") from the controller 30, the sequencer 17 executes a sequence corresponding to this NAND interface command (for example, a sequence for programming data). In accordance with this sequence, the sequencer 17 controls the operation of the sense amplifier 13, the operation of the page buffer 14, and the like. This sequencer 17 operates in synchronism with an internal clock ICLK transferred to the sequencer 17 from the oscillator 18, which will be described later.

<<Oscillators>>

The oscillator 18 (clock generator) generates the internal clock ICLK. The oscillator 18 transfers this generated internal clock ICLK to the sequencer 17.

The oscillator 19 (clock generator) generates the other internal clock ACLK. The oscillator 19 transfers the generated internal clock ACLK to the controller 30 and the like. This internal clock ACLK is a clock serving as a reference with which the controller 30 and the like operate in synchronism.

<<Input/Output Unit>>

As shown in FIG. 1, the input/output unit 20 includes a buffer portion 21, a burst buffer 22, an interface 23, an access controller 24 and an ECC (error checking and correction) portion 25.

<<Buffer Portion>>

As shown in FIG. 1, the buffer portion 21 includes multiple data RAMs (each of which will be also referred to as a memory portion) 21a, one boot RAM (also referred to as a memory portion) 21b, and a SRAM buffer 21c. The buffer portion 21 functions as the primary data cache for the NAND flash memory 10.

The two data RAMs 21a, which are shown in the case of FIG. 1, includes a first data RAM (corresponding to "Data Buffer0" in FIG. 1) and a second data RAM (corresponding to "Data Buffer1" in FIG. 1). The first data RAM is a data RAM used to transmit and receive data between the memory system 100 and a host apparatus via the burst buffer 22. On the other hand, the second data RAM is a data RAM for temporarily holding data of the page buffer 14. As a table, this information is beforehand stored in a ROM in a state machine 32, for example. Data Buffer0 is stored correspondingly in the first data RAM, while Data Buffer1 is stored correspondingly in the second data RAM. The capacity of each of the first and second RAMs is 4 kilobytes, for example.

As shown in FIG. 1, the multiple data RAMs 21a and the boot RAM 21b each include a memory cell array, a sense amplifier and a row decoder.

The memory cell array of each of the multiple data RAMs 21a includes multiple SRAM cells each capable of holding data. Each SRAM cell is connected to the corresponding paired word and bit lines. Like the memory cell array 11, the memory cell array of each data RAM 21a includes a region for holding main data, and a region for holding the parity and the like. The sense amplifier of each data RAM 21a senses/amplifies data which is read from a SRAM cell(s) to the corresponding bit line(s). In addition, the sense amplifier of each data RAM 21a functions as a load when data in the SRAM buffer 21c is written to the SRAM cell. The row decoder of each data RAM 21a selects a word line(s) in the memory cell array of the data RAM 21a.

The boot RAM 21b temporarily holds a boot code for activating the memory system 100, for example. The capacity of the boot RAM 21b is one kilobyte, for example.

The SRAM buffer 21c temporarily holds data when data is written to or read from any one of the data RAMs 21a and the boot RAM 21b.

As shown in FIG. 1, the SRAM buffer 21c is electrically connected to an ECC buffer 25a via an ECC data bus (corresponding to "ECC Data Bus" in FIG. 1). As a result, the SRAM buffer 21c enables data to be transferred between the SRAM buffer 21c and the ECC buffer 25a.

In addition, the SRAM buffer 21c enables data to be transferred between the SRAM buffer 21c and the burst buffer, which will be described later, via a RAM/Register bus. The SRAM buffer 21c includes a region for holding the main data, and a region for holding the parity and the like.

<<Burst Buffer>>

The burst buffer 22 is electrically connected to the SRAM buffer 21c and the controller 30 via the RAM/Register bus. As a result, the burst buffer 22 enables data to be transferred between the burst buffer 22 and the SRAM buffer 21c, as well as between the burst buffer 22 and the controller 30. Furthermore, the burst buffer 22 enables data to be transferred between the burst buffer 22 and the interface (including "PureNAND User I/F" and "OneNAND User I/F") 23. The burst buffer 22 temporarily holds data given from the host apparatus via the interface 23, or data given from the SRAM buffer 21c.

<<Interface>>

The interface 23 is capable of being connected to the host apparatus outside the memory system 100, and controls the input and output of various signals, such as data, control signals and addresses Add, to and from the host apparatus.

Examples of the control signals include: a chip enable signal /CE for enabling the entire memory system 100; an address valid signal /AVD for latching an address; a clock CLD for burst read; a write enable signal /WE for enabling a write operation; and an output enable signal /OE for enabling data to be outputted to the outside.

The interface 23 is electrically connected to the burst buffer 22 via a data input/data output bus.

The interface 23 transfers control signals, which are related to a data read request, a data load request, a data write request, a data program request and the like, from the host apparatus to the access controller 24. During the data read operation, the interface 23 outputs data, which is held in the burst buffer 22, to the host apparatus. During the data write operation, the interface 23 transfers data, which is given from the host apparatus, to the burst buffer 22.

<<Access Controller>>

The access controller 24 receives control signals and addresses from the interface 23. Thus, the access controller 24 controls the buffer portion 21 and the controller 30 in order to execute an operation which satisfies a request from the host apparatus.

To put it specifically, in accordance with the request from the host apparatus, the access controller 24 puts the buffer portion 21 or a register 33 in the controller 30 into an active state. Subsequently, the access controller 24 issues a data write command or a data read command (Write/Read) to the buffer portion 21. Otherwise, the access controller 24 issues a write command or a read command (Write/Read, which will hereinafter denote a "data register write command or a register read command") to the register 33. As a result, the buffer portion 21 or the controller 30 starts its operation.

<<ECC Portion>>

During the data read operation, the ECC portion 25 detects and corrects an error(s) included in data which is read from the NAND flash memory 10. On the other hand, during the data write operation, the ECC portion 25 generates a parity for data which needs to be programmed.

The ECC portion 25 includes the ECC buffer 25a and an ECC engine 25b. The ECC buffer 25a is connected to the page buffer 14 of the NAND flash memory 10 via the NAND data bus. Further, the ECC buffer 25a is connected to the buffer portion 21 via the ECC data bus.

During the data read operation, the ECC buffer 25a holds data which is transferred to the ECC buffer 25a from the page buffer 14, and transfers data, which finishes an ECC process (which finishes error correction during the data load operation), to the buffer portion 21. On the other hand, during the data write operation, the ECC buffer 25a holds data which is transferred to the ECC buffer 25a from the buffer portion 21, and transfers data and the corresponding parity, which are transferred to the ECC buffer 25a from the buffer portion 21, to the page buffer 12.

The ECC engine 25b performs an ECC process by use of data held in the ECC buffer 25a. The ECC engine 25b employs, for example, a one-bit correction method using the Hamming code. In addition, the ECC engine 25b uses the minimum parity data needed for the correction process.

<Controller>

As shown in FIG. 1, the controller 30 includes an address/command generator circuit (corresponding to "NAND Add/Command Generator" in FIG. 1) 31, the state machine 32, the register 33, a CUI (Command User Interface) 34, and an address/timing generator circuit (corresponding to "SRAM Add/Timing" in FIG. 1) 35.

<<Address/Command Generator Circuit>>

During an internal sequence operation, the address/command generator circuit 31 plays a roll of generating control signals, such as an address signal and a command, to the NAND flash memory 10 depending on the necessity.

<<State Machine>>

Upon reception of a command issued from the address/command generator circuit 31 or an internal command signal from the CUI 34, which will be described later, the state machine 32 controls the internal sequence operation depending on the type of the command.

<<Register>>

The register 33 is configured to set up an operational state of a function. By allocating a part of an external address space in the register 33, a control signal, such as an address signal or a command, is read from or written to the allocated part by the external host apparatus via the interface 23.

<<CUI>>

Once the control signal such as the address signal or the command is written to the predetermined part of the external address space in the register 33, the CUI 34 recognizes that the function execution command is given to the CUI 34, and issues an internal command signal.

<<Address/Timing Generator Circuit>>

The address/timing generator circuit 35 is configured to generate control signals, such as an address signal and a timing signal, for controlling the buffer portion 21 and the like depending on the necessity during the internal sequence operation.

[How Memory System Operates]

Figure 3:
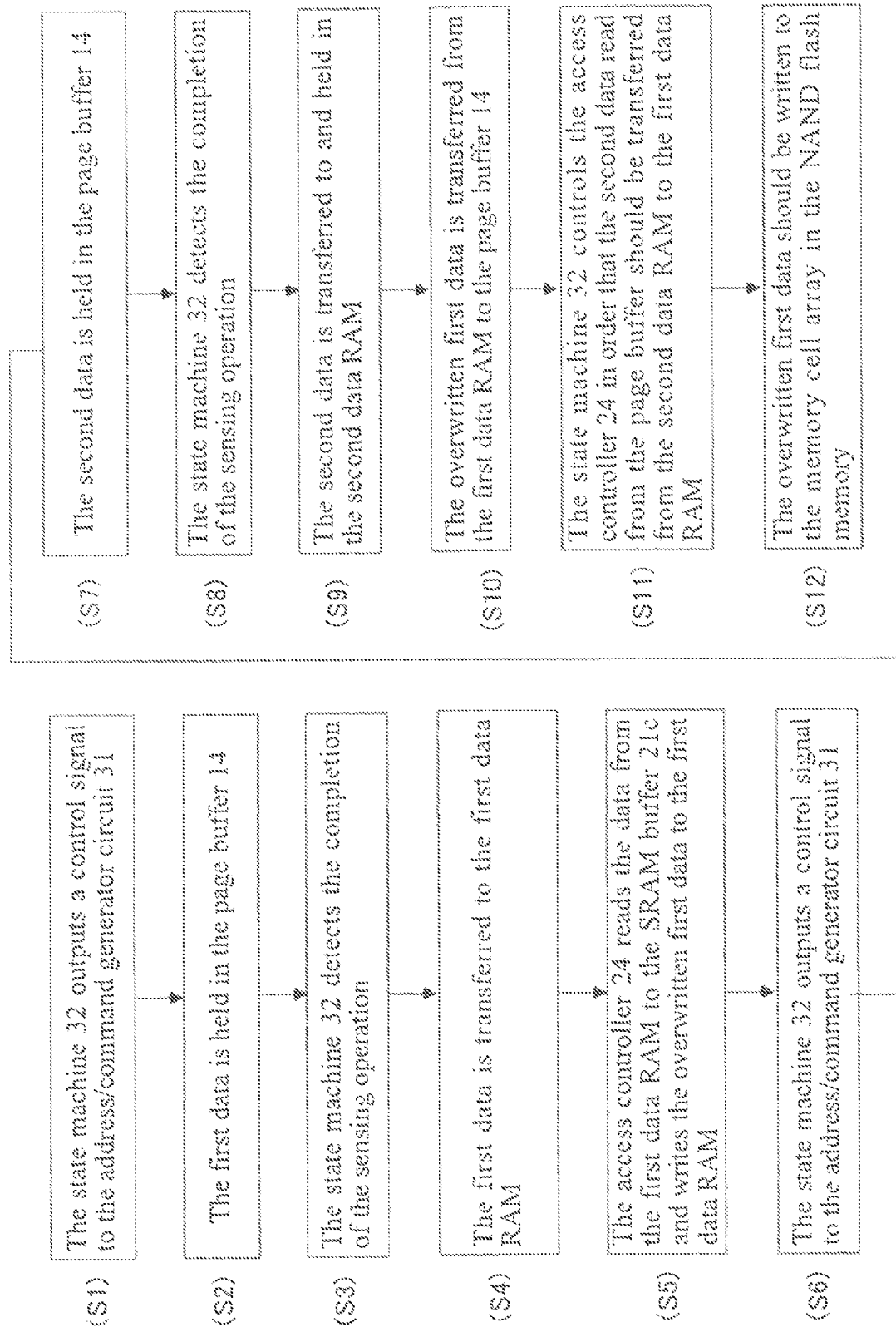
FIG. 3 is a flowchart diagram showing how data is transferred using the memory system of the first embodiment.

Using a flowchart shown in FIG. 3, description will be provided for how the memory system of the first embodiment operates. For the sake of explanatory convenience, the description is provided on the basis of an example in which data (first data intended to be overwritten) held in the buffer portion 21 and data (second data) held in the page buffer in the NAND flash memory 10 are swapped (exchanged) for each other in the case of overwriting data stored in the NAND flash memory 10.

First of all, in step S1, the state machine 32 of the controller 30 outputs a control signal to the address/command generator circuit 31 in order to make the address/command generator circuit 31 generate a data read command for reading the data (first data) intended to be overwritten from the data stored in the NAND flash memory.

In step S2, in response to the control signal, the address/command generator circuit 31 generates an address and a corresponding command, as well as outputs the address and the command to the sequencer 17. On the basis of the address and the command, the sequencer 17 controls sensing operation in order to enable one page of the first data to be held in the page buffer 14. As a result, the first data is held in the page buffer 14.

In step S3, once the first data is held in the page buffer 14, the sequencer 17 outputs a ready signal, which indicates the completion of the sensing operation, to the state machine 32. As a result, the state machine 32 detects that the first data is held in the page buffer.

In step S4, the state machine 32 controls the address/command generator circuit 31 in order to transfer the first data held in the page buffer 14 to the first data RAM in the buffer portion 21.

Figure 4:
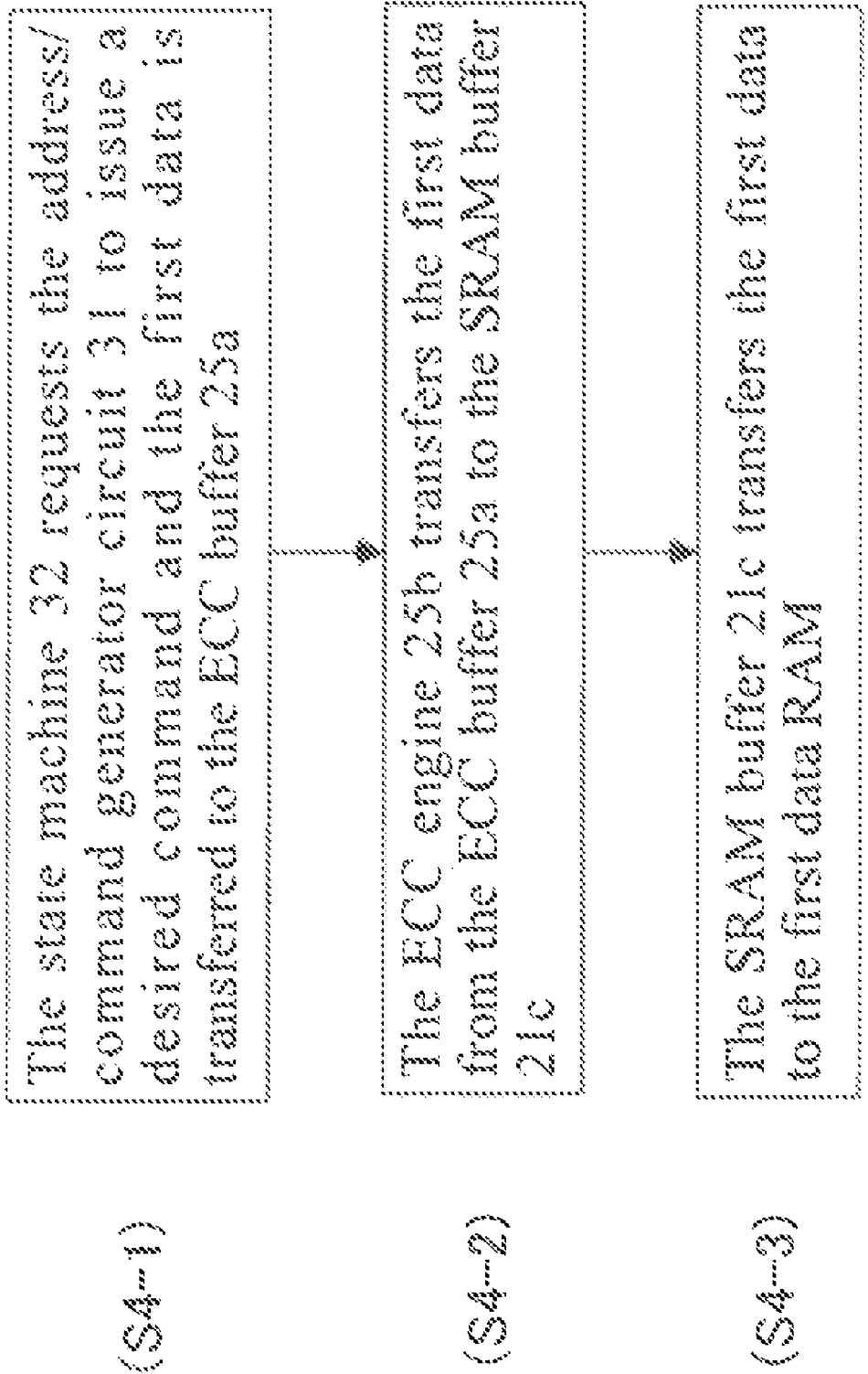
FIG. 4 is a flowchart diagram showing how data is transferred using the memory system of the first embodiment.

Using a flowchart shown in FIG. 4, description will be provided for concrete steps to be followed in order to transfer the first data to the first data RAM.

In step S4-1, the state machine 32 requests the address/command generator circuit 31 to issue a desired command. As a result, at the request of the state machine 32, the address/command generator circuit 31 issues the command to the sequencer 17. Thereby, the first data, which is held in the page buffer 14, is read to the NAND data bus. Subsequently, the data is transferred to the ECC buffer 25a, and is transferred to the ECC engine 25b via the ECC buffer 25a as well.

In step S4-2, once the state machine 33 issues a transfer signal (a signal for transferring the first data from the ECC buffer 25a to the SRAM buffer 21c) to the ECC engine 25c through the address/timing generator circuit 35, the ECC engine 25b transfers the first data from the ECC buffer 25a to the SRAM buffer 21c.

In step S4-3, the SRAM buffer 21c transfers the first data to the first data RAM, for example, from the SRAM data bus via the sense amplifier. The SRAM cell array in the first data RAM writes the data to the SRAM cell array in accordance with the SRAM address.

Through the foregoing steps, the first data is transferred to the first data RAM.

In step S5, once the user inputs a control signal for reading the first signal from the external host apparatus via the interface 23, the access controller 24 reads the data from the first data RAM to the SRAM buffer 21c. Subsequently, the access controller 24 causes the first data to be outputted to the host apparatus via, for example, the RAM/register data bus, the burst buffer 22 and the interface 23. Furthermore, once the user inputs a control signal for writing the overwritten first data from the host apparatus, the access controller 24 writes the overwritten first data to the first data RAM.

In step S6, the state machine 32 in the controller 30 outputs a control signal to the address/command generator circuit 31 in order to make the address/command generator circuit 31 generate a data read command for reading data (second data) which is held at a predetermined address in the NAND flash memory 10.

In step S7, in response to the control signal, the address/command generator circuit 31 generates an address and a corresponding command, and outputs the address and the corresponding command to the sequencer 17. On the basis of the address and the command, the sequencer 17 controls sensing operation in order to enable one page of the second data to be held in the page buffer 14. As a result, the second data is held in the page buffer 14.

In step S8, once the second data is held in the page buffer, the sequencer 17 outputs a ready signal, which indicates the completion of the sensing operation, to the state machine 32. As a result, the state machine 32 detects that the second data is held in the page buffer.

As in the case of step S4, in step S9, the state machine 32 controls the address/command generator circuit 31 and the ECC engine 25b in order that the second data held in the page buffer 14 should be transferred to the data RAM 21a (i.e., the second data RAM) of the buffer portion 21, in which the overwritten first data is not held. Thereby, the second data is transferred to and held in the second data RAM.

In step S10, the state machine 32 controls the address/timing generator circuit 35 in order that the overwritten first data should be transferred from the first data RAM to the page buffer 14. To put it specifically, the state machine 32 controls the address/timing generator circuit 35. Thus, the address/timing generator circuit 35 generates an address and a control signal, and outputs the address and the control signal to the access controller 24 and the ECC engine 25b. Thereby, the overwritten first data is transferred from the first data RAM to the page buffer 14.

In step S11, the state machine 32 controls the access controller 24 in order that the second data read from the page buffer should be transferred from the second data RAM to the first data RAM.

In step S12, the state machine 32 controls the address/command generator circuit 31 in order that the overwritten first data should be written to the memory cell array in the NAND flash memory. On the basis of the address and the command issued by the address/command generator circuit 31, the sequencer 17 writes the overwritten first data to the memory cell array 11.

Effects of First Embodiment

As described above, this embodiment can provide the memory system capable of exchanging the data held in the page buffer and the data held in the buffer portion for each other. Detailed descriptions will be provided hereinbelow.

In the memory system of this embodiment, the width of the data bus for electrically connecting the data RAMs in the primary data cache and the page buffer in the secondary data cache (i.e., the SRAM Data Bus, ECC Data Bus, and NAND Data Bus) is less than the capacity of the primary data cache and the capacity of the secondary data cache (i.e., the width of the data bus is less than a size of a page stored in the primary data cache or secondary data cache), unlike in a memory system (a comparative example) in which the width of a data bus for electrically connecting a primary data cache and a secondary data cache together is equal to the capacity of the primary data cache and the capacity of the secondary data cache. For this reason, the memory system of this embodiment would otherwise be incapable of swapping (exchanging) the data held in the first data cache and the data held in the second data cache for each other.

However, the memory system of this embodiment is capable of swapping the data held in the primary data cache and the data held in the secondary data cache for each other, because the memory system is provided with multiple data RAMs and the state machine 32 in the controller 30 performs control in order that the overwritten data and the read data can be held in the respective data RAMs.

(Modification 1)

[Configuration of Memory System of Modification 1]

Although the memory system of this embodiment causes the first data to be held in the first data RAM, a memory system of Modification 1 may cause the first data to be held in the boot RAM. This makes it unnecessary to provide the memory system with multiple data RAMs. As long as the memory system is provided with one data RAM and one boot RAM, the memory system is capable of swapping (exchanging) the data held in the primary data cache and the data held in the secondary data cache for each other. As a result, the area of the circuit of the memory system of Modification 1 can be reduced by the elimination of one of the multiple data RAMs.

[How Memory System of Modification 1 Operates]

The data held in the primary data cache and the data held in the secondary data cache can be swapped (exchanged) for each other. In a case where the capacity of the data RAM is 4 kilobytes and the capacity of the boot RAM is 1 kilobyte, the memory system of Modification 1 swaps (exchanges) the data held in the primary data cache and the data held in the secondary data cache for each other by repeating steps S9 through S11, which are part of the operation of the memory system of this embodiment, four times. In other words, the memory system of Modification 1 carries out an operation of, for each 1-kilobyte capacity, overwriting the first data and transferring the second data from the page buffer 14 to the second data RAM four times.

(Modification 2)

[Configuration of Memory System of Modification 2]

In the memory system of this embodiment, the first data RAM is a data RAM used when the memory system causes the data to be transmitted to and received from the host apparatus via the burst buffer 22, and the second data RAM is a data RAM for temporarily holding the data from the page buffer 14. Nevertheless, the memory system of Modification 2 may exchange the definition of the first data RAM and the definition of the second data RAM for each other before step S11 in the operation method of the memory system of this embodiment. In other word, "Data Buffer0" shown in FIG. 1 is redefined as the second data RAM, and "Data Buffer1" shown in FIG. 1 is redefined as the first data RAM. This makes it unnecessary for the memory system to perform step S11 which is described above. As a result, the memory system of Modification 2 performs, for example, an overwrite operation faster than the memory system of this embodiment.

[How Memory System of Modification 2 Operates]

The memory system of Modification 2 makes the state machine 32 access the table retained in the ROM in the state machine 32 between steps S10 and S11 in the operation method of the memory system of this embodiment, and changes the information in a way that "Data Buffer0" corresponds to the second data RAM and "Data Buffer1" corresponds to the first data RAM.

In addition to this, the memory system of Modification 2 performs control in order not to carry out step S11.

Second Embodiment 2

[How Memory System Operates]

Figure 5:
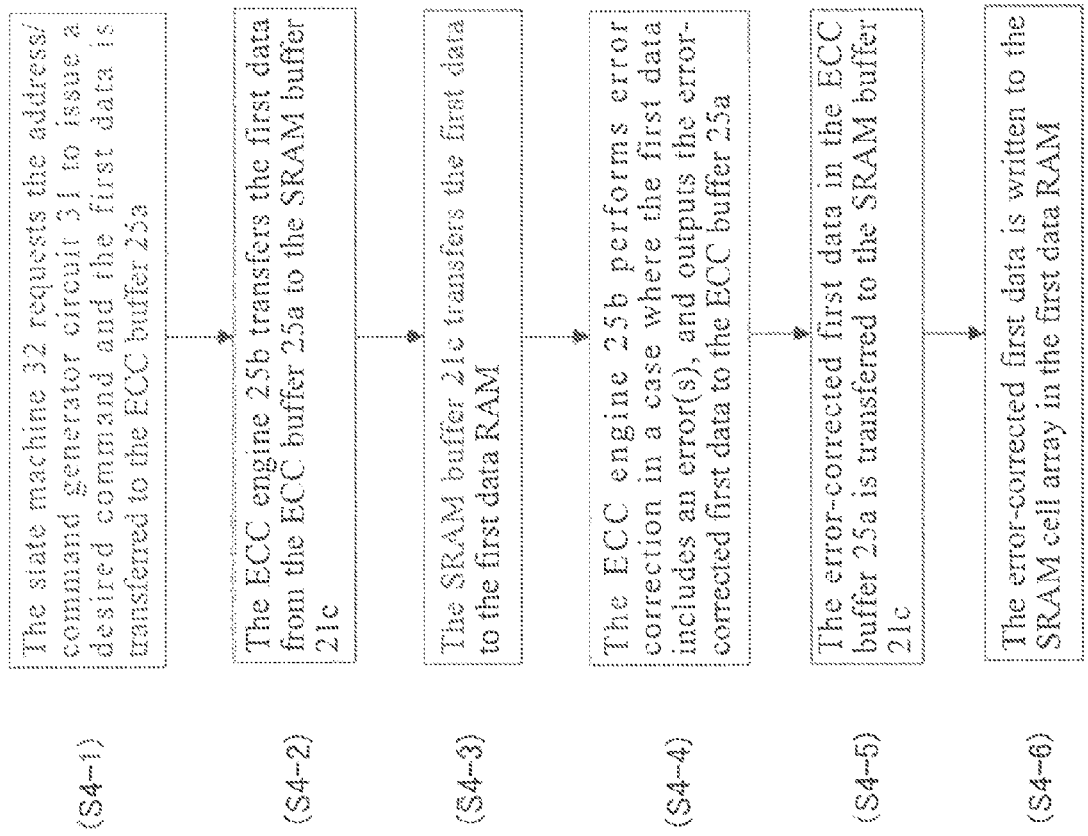
FIG. 5 is a flowchart diagram showing how data is transferred using the memory system of a second embodiment.

Using a flowchart shown in FIG. 5, description will be provided for how the memory system of the first embodiment operates in a different way. The operation method of the memory system of the second embodiment is different from the operation method of the memory system of the first embodiment in that the memory system of the second embodiment performs the ECC process during the read operation or the write operation. The rest of the operation method of the memory system of the second embodiment is the same as the rest of the operation method of the memory system of the first embodiment.

Steps S1 to S3, S6 to S8, S11 and S12 in the operation method of the memory system of the first embodiment are the same as those in the operation method of the memory system of the second embodiment.

Using a flowchart shown in FIG. 5, description will be provided for concrete steps to be followed in order to transfer the first data to the first data RAM in the second embodiment.

In step S4-1, the state machine 32 requests the address/command generator circuit 31 to issue a desired command. As a result, at the request of the state machine 32, the address/command generator circuit 31 issues the command to the sequencer 17. Thereby, the first data, which is held in the page buffer 14, is read to the NAND data bus. Subsequently, the data is transferred to the ECC buffer 25a, and is transferred to the ECC engine 25b via the ECC buffer 25a as well.

In step S4-2, once the state machine 33 issues a transfer signal (a signal for transferring the first data from the ECC buffer 25a to the SRAM buffer 21c) to the ECC engine 25c through the address/timing generator circuit 35, the ECC engine 25b transfers the first data from the ECC buffer 25a to the SRAM buffer 21c.

In step S4-3, the SRAM buffer 21c transfers the first data to the first data RAM, for example, from the SRAM data bus via the sense amplifier. The SRAM cell array in the first data RAM data writes the data to the SRAM cell array in accordance with the SRAM address.

Subsequently, in step S4-4, once the state machine 32 issues an ECC correction start control signal, the ECC engine 25b performs error correction in a case where the first data from the ECC buffer 25a includes an error(s), and outputs the error-corrected first data to the ECC buffer 25a. Thereafter, the error-corrected first data in the ECC buffer 25a is read to the ECC data bus, and is transferred to the SRAM buffer 21c in step S4-5. The SRAM buffer 21c transfers the error-corrected first data to the first data RAM from the SRAM data bus via the sense amplifier. The error-corrected first data is written to the SRAM cell array in the first data RAM in step S4-6. If the first data is already held in the first data RAM, the error-corrected first data is overwritten on the data in the first data RAM. The first error-corrected data is newly called the first data.

It should be noted that the ECC process is similarly performed in step S9.

In step S10, the state machine 32 controls the address/timing generator circuit 35 in order that the overwritten first data should be transferred from the first data RAM to the page buffer 14. Descriptions of concrete steps are provided below, in accordance with the flow diagram of FIG. 6.

In step S10-1, the state machine 32 controls the address/timing generator circuit 35. Thus, the address/timing generator circuit 35 generates an address and a control signal, as well as outputs the address and the control signal to the access controller 24. Thereby, the overwritten first data is read to the ECC buffer via the ECC data bus, and the resulting data is transferred to the ECC buffer 25a.

In step S10-2, the state machine 32 controls the ECC engine 25b in order that the overwritten first data should be written to the page buffer 14 via the NAND data bus.

Once the state machine 32 issues an ECC parity generation starting control signal, the ECC engine 25b produces a parity which corresponds to the overwritten first data from the ECC buffer.

Subsequently, the state machine 32 controls the ECC engine 25b in order that the produced parity should be written to the page buffer 14 via the NAND data bus.

Thereby, the parity corresponding to the overwritten first data is held in the page buffer 14.

Effects of Second Embodiment

As described above, this embodiment can provide a memory system capable of exchanging the data held in the page buffer and the data held in the buffer portion for each other, as in the case of the first embodiment. Detailed descriptions will be provided hereinbelow.

In addition, unlike the memory system of the first embodiment, the memory system of this embodiment performs the ECC process during the data read operation and the data write operation on the page buffer. Accordingly, this embodiment can provide the memory system capable of performing data exchange on the ECC-processed first or second data.

(Modification 3)

Although the memory system of the second embodiment causes the first data to be held in the first data RAM, a memory system of Modification 3 may cause the first data to be held in the boot RAM. This makes it unnecessary to provide the memory system with the multiple data RAMs. As long as the memory system is provided with one data RAM and one boot RAM, the memory system is capable of swapping (exchanging) the data held in the primary data cache and the data held in the secondary data cache for each other. As a result, the area of the circuit of the memory system of Modification 3 can be reduced by the elimination of one of the multiple data RAMs.

The operation of the memory system of Modification 3 can be achieved by applying the operation method of the memory system of Modification 1 to the memory system of the second embodiment.

(Modification 4)

In the memory system of this embodiment, the first data RAM is a data RAM used when the memory system causes the data to be transmitted to and received from the host apparatus via the burst buffer 22, and the second data RAM is a data RAM for temporarily holding the data from the page buffer 14. Nevertheless, the memory system of Modification 4 may exchange the definition of the first data RAM and the definition of the second data RAM for each other before step S11 in the operation method of the memory system of this embodiment. In other word, "Data Buffer0" shown in FIG. 1 is redefined as the second data RAM, and "Data Buffer1" shown in FIG. 1 is redefined as the first data RAM. This makes it unnecessary for the memory system to perform step S11 which is described above. As a result, the memory system of Modification 4 performs, for example, an overwrite operation faster than the memory system of this embodiment.

The operation of the memory system of Modification 4 can be achieved by applying the operation method of the memory system of Modification 1 to the memory system of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor memory system comprising:
a NAND flash memory including a page buffer capable of holding a page of data and a cell array having a plurality of pages;
a plurality of memory portions electrically connected to the NAND flash memory by a data bus; and
a controller configured to control the NAND flash memory and the plurality of memory portions, wherein
a width of the data bus is less than a size of the page of data, and
when any one of a write operation and a read operation is performed on the NAND flash memory, the controller exchanges data held in the page buffer with data held in one memory portion of the plurality of memory portions.

2. The semiconductor memory system of claim 1, wherein:
the page buffer holds first data, and the one memory portion of the plurality of memory portions holds second data; and
when any one of the write operation and the read operation is performed on the NAND flash memory, the controller transfers the first data to a memory portion of the plurality of memory portions, in which the second data is not held, and transfers the second data to the page buffer.

3. The semiconductor memory system of claim 1, wherein:
the page buffer holds first data, and the plurality of memory portions include a first memory portion in which second data is held and a second memory portion in which the second data is not held; and
when any one of the write operation and the read operation is performed on the NAND flash memory, the controller transfers the first data to the second memory portion, transfers the second data to the page buffer, and transfers the first data to the first memory portion.

4. The semiconductor memory system of claim 2, wherein:
the plurality of memory portions include a first memory portion as the one memory portion of the plurality of memory portions in which second data is held and a second memory portion as the memory portion in which the second data is not held; and
when any one of the write operation and the read operation is performed on the NAND flash memory, the controller transfers the first data to the second memory portion, transfers the second data to the page buffer, and transfers the first data to the first memory portion.

5. The semiconductor memory system of claim 3, further comprising:
an ECC portion including an error correcting circuit configured to generate a parity when the write operation is performed on the NAND flash memory, and to detect an error on the basis of the parity concerning the data held in the page buffer when the read operation is performed on the NAND flash memory, wherein
when any one of the write operation and the read operation is performed on the NAND flash memory, the controller transfers the first data to the second memory portion and the ECC portion,
rewrites error-corrected first data outputted from the ECC portion on the first data held in the second memory portion when the first data includes an error,
transfers the second data to the page buffer and the ECC portion, and
transfers the parity outputted from the ECC portion to the page buffer.

6. The semiconductor memory system of claim 4, further comprising:
an ECC portion including an error correcting circuit configured to generate a parity when the write operation is performed on the NAND flash memory, and to detect an error on the basis of the parity concerning the data held in the page buffer when the read operation is performed on the NAND flash memory, wherein when any one of the write operation and the read operation is performed on the NAND flash memory, the controller transfers the first data to the second memory portion and the ECC portion, rewrites error-corrected first data outputted from the ECC portion on the first data held in the second memory portion when the first data includes an error, transfers the second data to the page buffer and the ECC portion, and transfers the parity outputted from the ECC portion to the page buffer.

7. The semiconductor memory system of claim 2, wherein:
a size of the memory portion in which the second data is not held is less than a size of the one memory portion of the plurality of memory portions that holds the second data.

8. The semiconductor memory system of claim 4, wherein:
a size of the second memory portion is less than a size of the first memory portion.

9. The semiconductor memory system of claim 6, wherein:
a size of the second memory portion is less than a size of the first memory portion.

10. The semiconductor memory system of claim 3, wherein:
the controller exchanges a definition of the first memory portion with a definition of the second memory portion after the controller transfers the first data to the second memory portion.

11. The semiconductor memory system of claim 5, wherein:
the controller exchanges a definition of the first memory portion with a definition of the second memory portion after the controller transfers the first data to the second memory portion.

12. The semiconductor memory system of claim 7, wherein:
when any one of the write operation and the read operation is performed on the NAND flash memory, the controller repeats a step of transferring the first data to a memory portion out of the plurality of memory portions in which the second data is not held, and transferring the second data to the page buffer.

13. The semiconductor memory system of claim 8, wherein:
when any one of the write operation and the read operation is performed on the NAND flash memory, the controller repeats a step of transferring the first data to the second memory portion, transferring the second data to the page buffer, and transferring the first data to the first memory portion.

14. The semiconductor memory system of claim 9, wherein:
when any one of the write operation and the read operation is performed on the NAND flash memory, the controller repeats a step of transferring the first data to the second memory portion and the ECC portion, rewriting error-corrected first data outputted from the ECC portion on the first data held in the second memory portion when the first data includes an error, transferring the second data to the page buffer and the ECC portion, and transferring the parity outputted from the ECC portion to the page buffer.

15. A semiconductor memory system comprising:
a NAND flash memory including a page buffer capable of holding a page of data and a cell array having a plurality of pages;

a plurality of memory portions electrically connected to the NAND flash memory by a data bus having a width less than a size of the page of data; and means for controlling the NAND flash memory and the plurality of memory portions so that when any one of a write operation and a read operation is performed on the NAND flash memory, the means for controlling exchanges data held in the page buffer with data held in one memory portion of the plurality of memory portions.

* * * * *